US008618871B2

(12) United States Patent
Kodama (10) Patent No.: US 8,618,871 B2
(45) Date of Patent: Dec. 31, 2013

(54) NOISE REDUCTION DEVICE AND SEMICONDUCTOR DEVICE HAVING THE SAME

(71) Applicant: Lapis Semiconductor Co., Ltd., Hachioji (JP)

(72) Inventor: Yuki Kodama, Tokyo (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 13/653,584

(22) Filed: Oct. 17, 2012

(65) Prior Publication Data
US 2013/0099841 A1    Apr. 25, 2013

(30) Foreign Application Priority Data
Oct. 21, 2011   (JP) .................................. 2011-231615

(51) Int. Cl.
*H03K 5/00* (2006.01)
(52) U.S. Cl.
USPC .......................................... 327/551; 327/552
(58) Field of Classification Search
USPC .................... 327/551–559, 336–337, 205
See application file for complete search history.

(56) References Cited

U.S. PATENT DOCUMENTS

| 5,128,973 A | * | 7/1992 | Sasaki et al. ..................... 377/28 |
| 5,438,292 A | * | 8/1995 | Tadokoro ....................... 327/206 |
| 5,920,221 A | * | 7/1999 | Shen et al. ..................... 327/264 |

FOREIGN PATENT DOCUMENTS

JP    2009-055470 A    3/2009

* cited by examiner

*Primary Examiner* — Dinh T. Le
(74) *Attorney, Agent, or Firm* — Kubotera & Associates, LLC (57) ABSTRACT

A semiconductor device includes a first terminal for receiving a first signal; a second terminal for receiving a second signal having more restriction than the first signal with respect to a delay upon transmitting to an internal circuit; a first noise reduction circuit; and a second noise reduction circuit. The first noise reduction circuit includes a first Schmitt circuit for receiving the first signal from the first terminal; and an output signal adjusting unit for adjusting an output signal of the first Schmitt circuit when the output signal is maintained for a specific period of time after the output signal is varied. The second noise reduction circuit includes a second Schmitt circuit for receiving the second signal from the second terminal; and an input signal adjusting unit for adjusting the second signal input to the second Schmitt circuit according to a fluctuation of a power source voltage.

11 Claims, 9 Drawing Sheets

NOISE REDUCTION DEVICE AND SEMICONDUCTOR DEVICE HAVING THE SAME

BACKGROUND OF THE INVENTION AND RELATED ART STATEMENT

The present invention relates to a noise reduction device and a semiconductor device having the noise reduction device. More specifically, the present invention relates to a noise reduction device including a plurality of noise reduction circuits and a semiconductor device having the noise reduction device.

In general, a conventional semiconductor device may include a conventional noise reduction circuit for reducing an external turbulent noise, a power source noise, and the like superimposed on an input signal. Such a conventional noise reduction circuit may include a Schmitt circuit and a low pass filter formed of a capacitance element and a resistor element.

Patent Reference 1 has disclosed such a conventional noise reduction circuit. The conventional noise reduction circuit is formed of a first delay circuit for receiving an input signal and outputting a first delayed signal delayed by a first delayed amount; a first logic circuit for receiving the input signal and the first delayed signal and performing a first logic calculation to output a first signal; a second delay circuit for receiving the first signal and outputting a second delayed signal delayed by a second delayed amount; and a second logic circuit for receiving the first signal and the second delayed signal and performing a second logic calculation to output a second signal. In the conventional noise reduction circuit disclosed in Patent Reference, it is configured such that the second delayed amount is greater than the first delayed amount.

Patent Reference: Japanese Patent Publication No. 2009-55470

Figure 8:
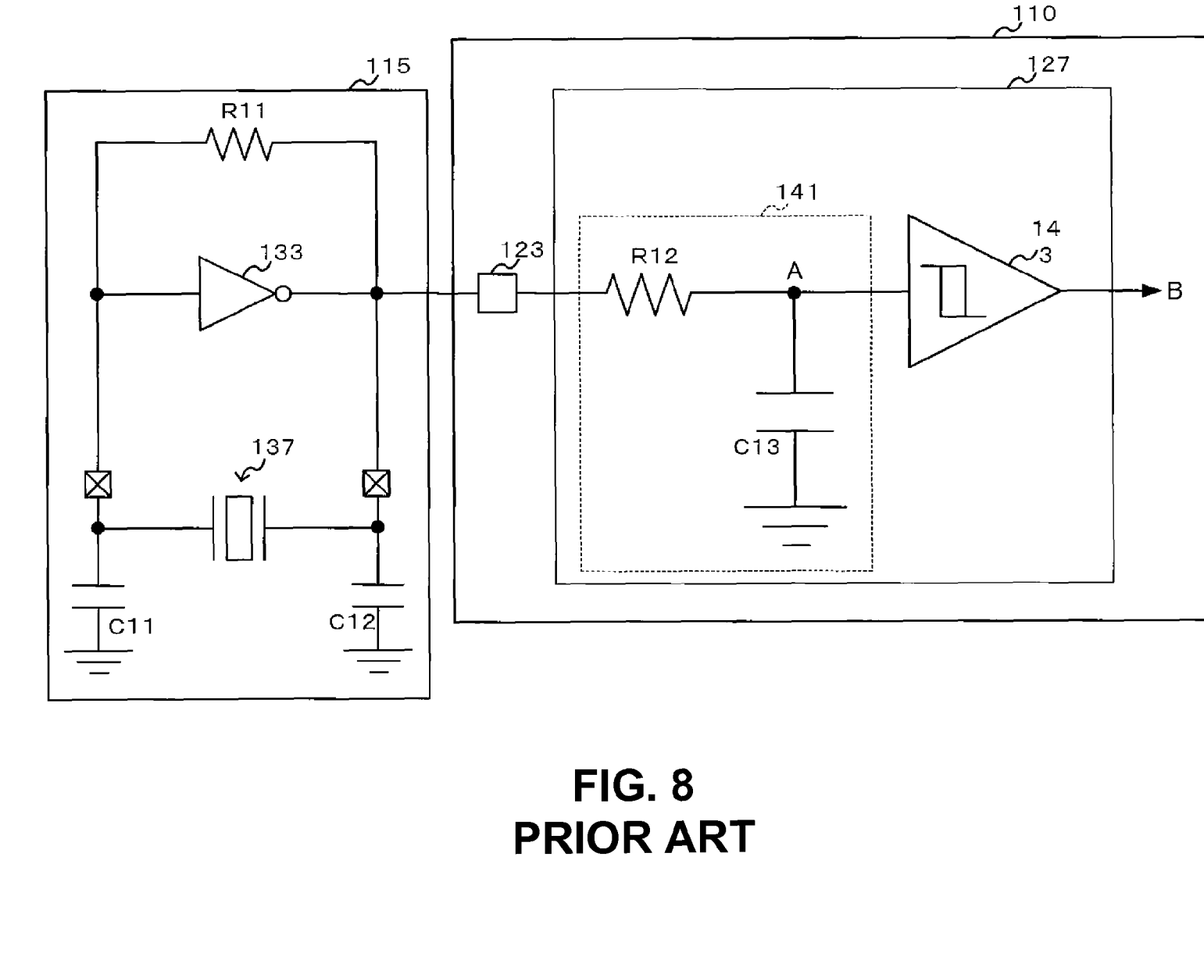
FIG. 8 is a circuit diagram showing a configuration of a conventional semiconductor device having a conventional noise reduction circuit and an external circuit.

An example of a conventional semiconductor device 110 having the conventional noise reduction circuit will be shown in FIG. 8. FIG. 8 is a circuit diagram showing the conventional semiconductor device 110 having a conventional noise reduction circuit 127 and an external circuit 115.

As shown in FIG. 8, the external circuit 115 is disposed outside the conventional semiconductor device 110. Further, an output signal of the external circuit 115 is input into the conventional noise reduction circuit 127 through an input terminal 123.

The external circuit 115 has a function of outputting a signal input into the conventional semiconductor device 110 through the input terminal 123. As shown in FIG. 8, the external circuit 115 is a crystal oscillation circuit including an inverter 133, a crystal oscillation element 137, a resistor element R11, a capacitor element C11, and a capacitor element C12. In the external circuit 115, when the capacitor element C11 and the capacitor element C12 are repeatedly charged and discharged, the crystal oscillation element 137 is oscillated to perform an oscillation operation. Then, the inverter 133 amplifies an oscillation signal, and the external circuit 115 outputs the oscillation signal.

Accordingly, the oscillation signal output from the external circuit 115 is input into the input terminal 123 of the conventional semiconductor device 110. When the oscillation signal is input into the input terminal 123, an external turbulent noise due to an external turbulence and the like may be superimposed on the oscillation signal.

As shown in FIG. 8, the conventional noise reduction circuit 127 includes a low pass filter formed of a resistor element R12 and a capacitor element C13 for removing noise superimposed on the oscillation signal, and a Schmitt circuit 143.

In the conventional noise reduction circuit 127, a time constant of the low pass filter 141 and a Schmitt width of the Schmitt circuit 143 are adjusted according to the noise superimposed on the oscillation signal. Accordingly, the conventional noise reduction circuit 127 passes the oscillation signal in an original form to be output to an internal circuit (not shown), while removing the noise superimposed on the oscillation signal.

In the conventional noise reduction circuit 127 shown in FIG. 8, however, it is difficult to remove a noise (a power source noise) superimposed by a power source and accompanied by a fluctuation of the power source. Accordingly, the oscillation signal thus output may be inverted due to the power source noise.

Figure 9:
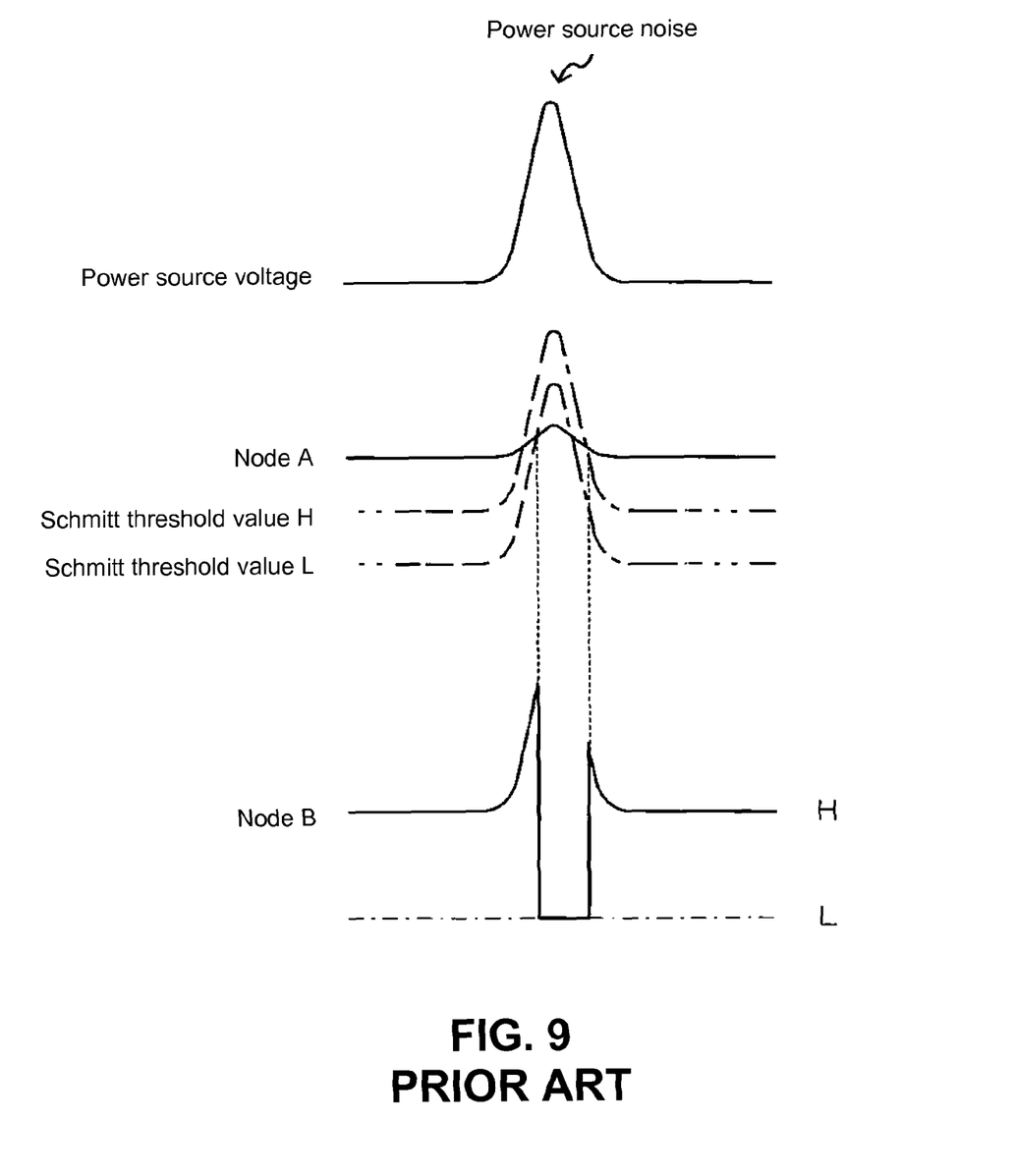
FIG. 9 is a chart showing an example of a relationship among a power source voltage, threshold values of a Schmitt circuit, a voltage of each of nodes of the conventional noise reduction circuit when the power source noise is generated.

FIG. 9 is a chart showing an example of a relationship among a power source voltage, threshold values of the Schmitt circuit 143, a voltage of a node A, and a voltage of a node B in the conventional noise reduction circuit 127 when the power source noise is generated.

As shown in FIG. 9, when the signal input from the external circuit 115 through the input terminal 123 has a high (H) level, if the power voltage is suddenly increased due to the power source noise, the input of the Schmitt circuit 143 (the node A) does not follow the sudden increase due to a filter characteristic.

On the other hand, the threshold values (the Schmitt threshold value H and the Schmitt threshold value L) of the Schmitt circuit 143 vary following the sudden increase in the power source voltage. Accordingly, the voltage of the note A becomes smaller than the threshold values of the Schmitt circuit 143. As a result, when the Schmitt circuit 143 outputs the output signal having the high (H) level, an unexpected glitch having a low (L) level pulse is generated in the output of the Schmitt circuit 143 (the node B).

When the unexpected glitch is generated and the output signal is inverted, a whole system (the internal circuit) may malfunction.

Further, in general, there have been many cases in which a same noise reduction circuit is used relative to different input signals when an extent of the noise is small as long as the noise is a similar type. For example, there have been many cases in which it is possible to use the conventional noise reduction circuit 127 described above. However, when the noise reduction circuit is used at the input terminal (the input pad), it is difficult to use the same noise reduction circuit due to other restrictions according to the input signal if the extent of the noise is not small.

In view of the problems described above, an object of the present invention is to provide a semiconductor device and a noise reduction device capable of solving the problems of the conventional noise reduction device. In the present invention, it is possible to reduce the noise more effectively through applying various measures depending on a type of an input terminal according to an input signal relative to the noise accompanying the fluctuation in the power source voltage.

Further objects and advantages of the invention will be apparent from the following description of the invention.

SUMMARY OF THE INVENTION

In order to attain the objects described above, according to a first aspect of the present invention, a semiconductor device includes a first terminal for receiving a first signal; a second terminal for receiving a second signal having more restriction than the first signal with respect to a delay upon transmitting to an internal circuit; a first noise reduction circuit; and a second noise reduction circuit.

According to the first aspect of the present invention, in the semiconductor device, the first noise reduction circuit includes a first Schmitt circuit for receiving the first signal from the first terminal; and an output signal adjusting unit for adjusting an output signal of the first Schmitt circuit output to the internal circuit when the output signal is maintained for a specific period of time after the output signal is varied.

According to the first aspect of the present invention, in the semiconductor device, the second noise reduction circuit includes a second Schmitt circuit for receiving the second signal from the second terminal; and an input signal adjusting unit for adjusting the second signal input to the second Schmitt circuit according to a fluctuation of a power source voltage, so that the second noise reduction outputs the output signal of the second Schmitt circuit to the internal circuit.

According to a second aspect of the present invention, a noise reduction device includes a first noise reduction circuit and a second noise reduction circuit. The first noise reduction circuit includes a first Schmitt circuit for receiving a first signal; and an output signal adjusting unit for adjusting an output signal of the first Schmitt circuit output to an internal circuit when the output signal is maintained for a specific period of time after the output signal is varied.

According to the second aspect of the present invention, in the noise reduction device, the second noise reduction circuit includes a second Schmitt circuit for receiving a second signal having more restriction than the first signal with respect to a delay upon transmitting to the internal circuit; and an input signal adjusting unit for adjusting a second signal input to the second Schmitt circuit according to a fluctuation of a power source voltage, so that the second noise reduction outputs the output signal of the second Schmitt circuit to the internal circuit.

In the present invention, when a noise is generated associated with the fluctuation of the power source voltage, it is possible to improve the noise resistance of the device through applying various methods according to the type of input terminal corresponding to the input signal.

DETAILED DESCRIPTION OF PREFERRED EMBODIMENTS

Hereunder, preferred embodiments of the present invention will be explained with reference to the accompanying drawings.

Figure 1:
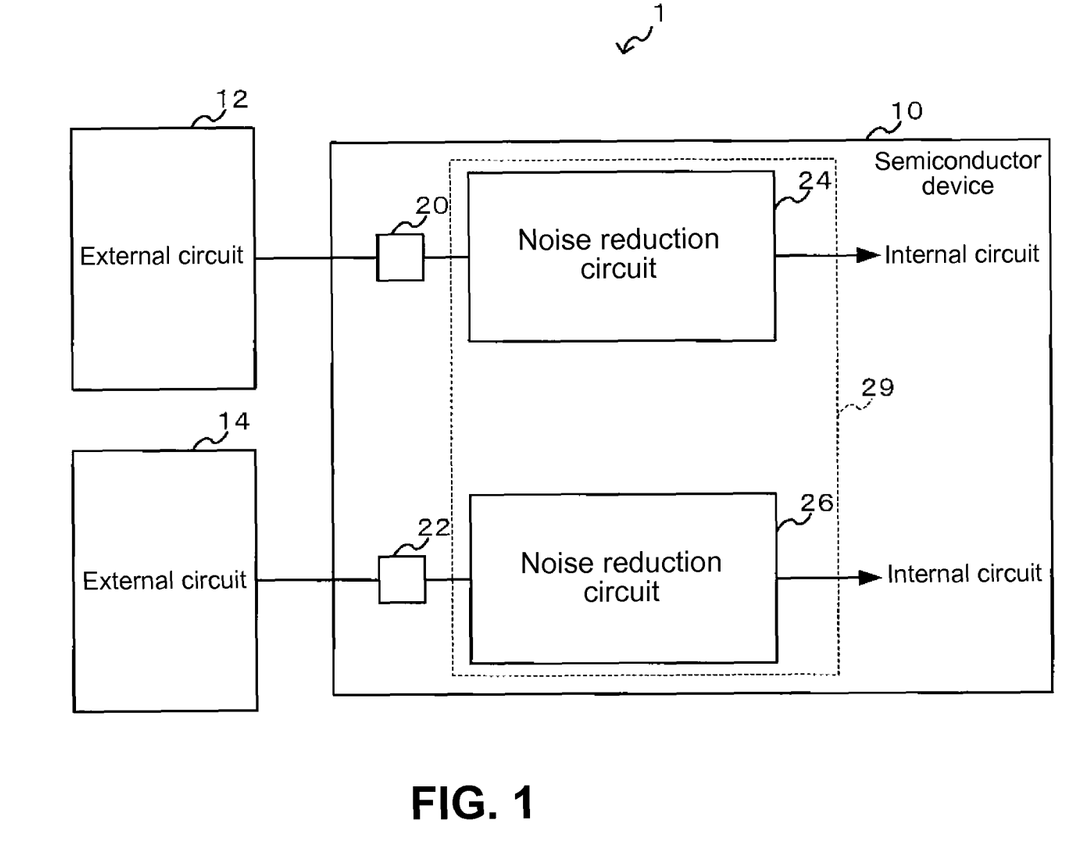
FIG. 1 is a block diagram view showing an example of a configuration of a semiconductor integrated circuit according to an embodiment of the present invention.

An embodiment of the present invention will be explained. First, a configuration of a semiconductor integrated circuit 1 having a semiconductor device 10 will be explained with reference to FIG. 1. FIG. 1 is a block diagram view showing an example of a configuration of the semiconductor integrated circuit 1 having the semiconductor device 10 according to the embodiment of the present invention.

As shown in FIG. 1, the semiconductor integrated circuit 1 includes the semiconductor device 10, an external circuit 12 disposed outside the semiconductor device 10, and an external circuit 14 disposed outside the semiconductor device 10.

In the embodiment, the semiconductor device 10 includes an input terminal 20; an input terminal 22; a noise reduction circuit 24; and a noise reduction circuit 26. When a signal is input from the external circuit 12 through the input terminal 20, the signal is input into the noise reduction circuit 24. After the noise reduction circuit 24 removes an external turbulent noise and a power source noise, the noise reduction circuit 24 outputs an output signal into an internal circuit (now shown) of the semiconductor device 10. Similarly, when a signal is input from the external circuit 14 through the input terminal 22, the signal is input into the noise reduction circuit 26. After the noise reduction circuit 26 removes an external turbulent noise and a power source noise, the noise reduction circuit 26 outputs an output signal into an internal circuit (now shown) of the semiconductor device 10.

In the embodiment, the external turbulent noise is defined as a noise superimposed on the signals input from the external circuit 12 and the external circuit 14 (oscillation signals, described later) due to an external turbulence and the like. The power source noise is defined as a noise superimposed on a power voltage and causing a fluctuation in the power source voltage. The external turbulent noise and the power source noise may be collectively referred to as a noise.

In the embodiment, it is noted that a power source (not shown) such as a power source supplying unit and the like is disposed in the semiconductor integrated circuit 1 for supplying the power voltage to the circuits (the internal circuits and the like) disposed in the semiconductor device 10 including the noise reduction circuit 24 and the noise reduction circuit 26, the external circuit 12, and the external circuit 14. The present invention is not limited to the configuration. It may be possible to supply the power voltage from outside the semiconductor integrated circuit 1. Alternatively, it may be possible to separately supply the power voltage to each of the external circuit 12, the external circuit 14, and the semiconductor device 10 from separate power sources.

In the embodiment, the signal input from the external circuit 14 through the input terminal 22 has more restrictions related to a delay of transmission to the internal circuit compared with the signal input from the external circuit 12 through the input terminal 20. Further, the signal input from the external circuit 14 through the input terminal 22 has a higher oscillation frequency.

A process of reducing the noise in each of the noise reduction circuit 24 and the noise reduction circuit 26 will be explained next. First, the process of reducing the noise in the noise reduction circuit 24 will be explained. As describe above, the noise reduction circuit 24 has the function of reducing the noise of the signal (the oscillation signal) input from the external circuit 12, and outputting the signal to the internal circuit.

Figure 2:
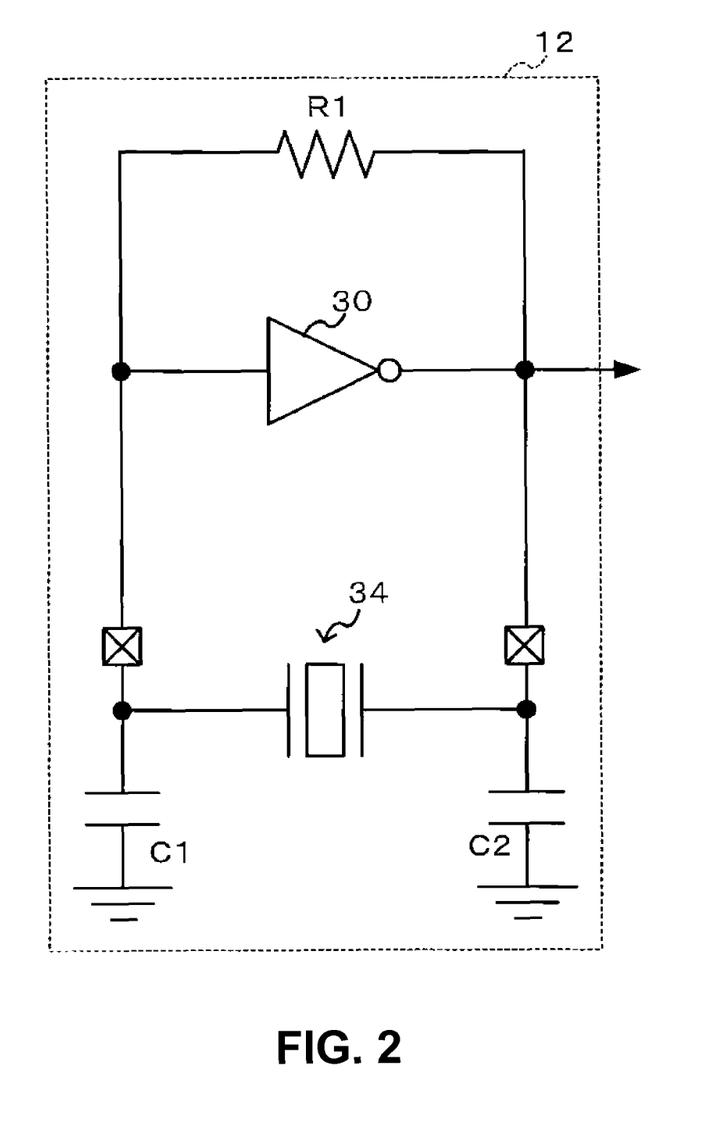
FIG. 2 is a circuit diagram showing an example of a configuration of an external circuit of the semiconductor integrated circuit according to the embodiment of the present invention.

FIG. 2 is a circuit diagram showing an example of a configuration of the external circuit 12 of the semiconductor integrated circuit 1 according to the embodiment of the present invention.

As shown in FIG. 2, the external circuit 12 is a crystal oscillation circuit including an inverter 30; a crystal oscillation element 34; a resistor element R1; a capacitor element C1; and a capacitor element C2.

In the embodiment, when the external circuit 12 outputs the oscillation signal, the capacitor element C1 and the capacitor element C2 are repeatedly charged and discharged, so that the crystal oscillation element 34 is oscillated to perform an oscillation operation. Then, the inverter 30 amplifies the oscillation signal, and the external circuit 12 outputs the oscillation signal. It should be noted that, when the oscillation signal is at a high (H) level, the capacitor element C1 is in a charged state and the capacitor element C2 is in a discharged state. When the oscillation signal is at a low (L) level, the capacitor element C1 is in the discharged state and the capacitor element C2 is in the charged state.

Figure 3:
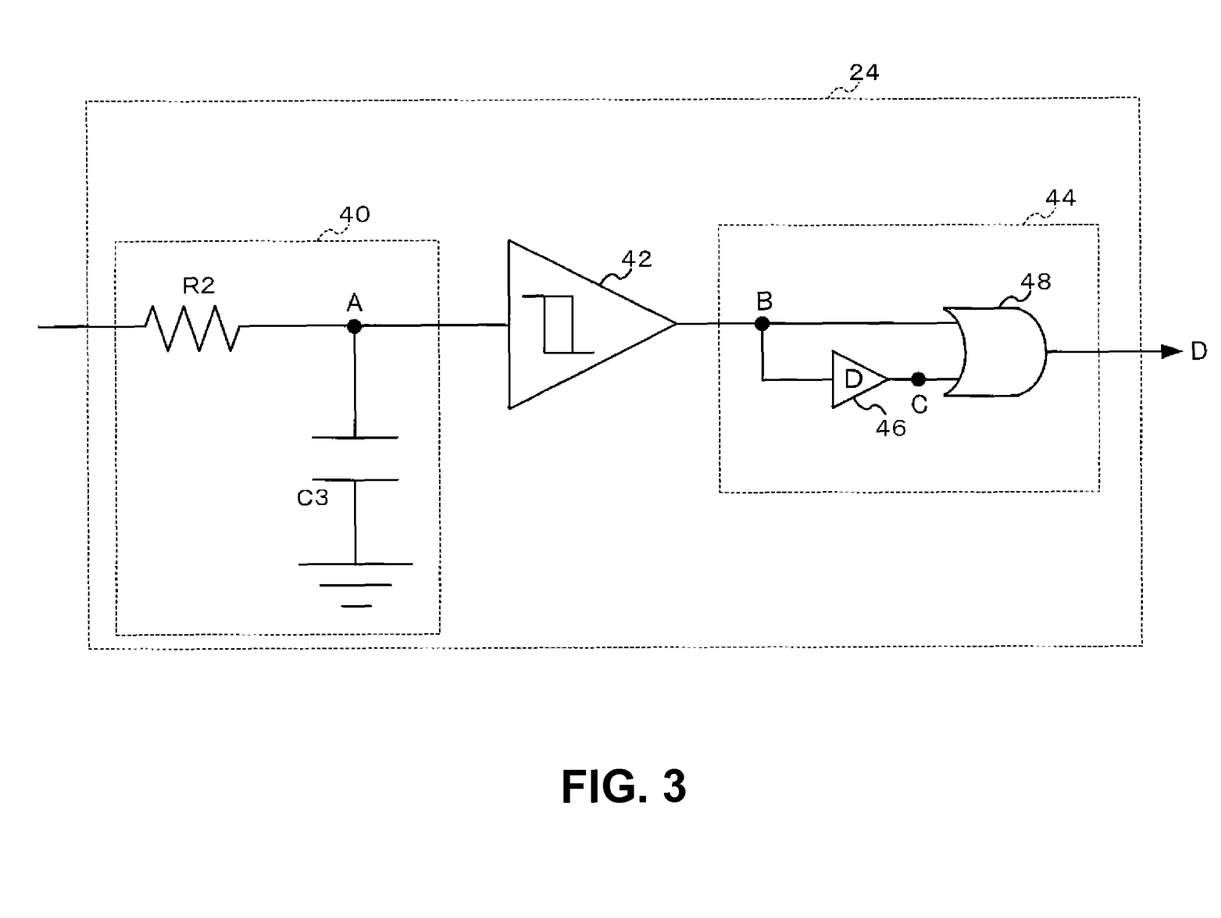
FIG. 3 is a circuit diagram showing an example of a configuration of a noise reduction circuit of the semiconductor integrated circuit according to the embodiment of the present invention.

In the embodiment, when the external circuit 12 outputs the oscillation signal, the oscillation signal is input into the noise reduction circuit 24 through the input terminal 20. FIG. 3 is a circuit diagram showing an example of a configuration of the noise reduction circuit 24 of the semiconductor integrated circuit 1 according to the embodiment of the present invention. As shown in FIG. 3, the noise reduction circuit 24 includes a low pass filter 40, a Schmitt circuit 42, and an output signal adjusting unit 44.

In the embodiment, the low pass filter 40 is formed of a resistor element R2 and a capacitor element C3. Further, the low pass filter 40 has a function of cutting a high frequency component of the oscillation signal input from the external circuit 12, on which the noise is superimposed, so that it is possible to minimize a rapid voltage fluctuation due to the external turbulent noise.

In the embodiment, the Schmitt circuit 42 has a Schmitt threshold value H and a Schmitt threshold value L (the Schmitt threshold value H>the Schmitt threshold value L).

In the embodiment, when a potential of the oscillation signal thus input exceeds the Schmitt threshold value H, the Schmitt circuit 42 outputs a signal having the H level. When the potential of the oscillation signal thus input is less than the Schmitt threshold value L, the Schmitt circuit 42 outputs the signal having the L level. Further, when the potential of the oscillation signal thus input is between the Schmitt threshold value H and the Schmitt threshold value L, the Schmitt circuit 42 maintains the level of the signal output immediately before.

In the embodiment, the noise reduction circuit 24 is configured such that a time constant of the low pass filter 40 and a Schmitt width of the Schmitt circuit 42 are adjusted according to the external turbulent noise superimposed on the oscillation signal input from the external circuit 12. The Schmitt width of the Schmitt circuit 42 is defined to be equal to a difference between the Schmitt threshold value H and the Schmitt threshold value L (the Schmitt threshold value H–the Schmitt threshold value L). Accordingly, the noise reduction circuit 24 has the function of removing the external turbulent noise superimposed on the oscillation signal thus input.

In the embodiment, the output signal adjusting unit 44 is formed of a delay circuit 46 and an OR circuit 48. It is configured such that the output signal of the Schmitt circuit 42 is input into the delay circuit 46. It should be noted that the delay circuit 46 includes a D latch circuit and the like, and the present invention is not limited thereto. Further, a delay time t of the output signal through the delay circuit 46 is determined based on the power source noise superimposed on the power source voltage, a period of time that the delay of the signal transmission to the internal circuit is possible, and the like.

In the embodiment, the OR circuit 48 is a logic sum circuit for outputting a logic sum of the output signal from the Schmitt circuit 42 and the output signal delayed by the delay circuit 46. Accordingly, when both of the output signal from the Schmitt circuit 42 and the output signal delayed by the delay circuit 46 have the H level, the OR circuit 48 outputs the signal having the L level. Otherwise, the OR circuit 48 outputs the signal having the H level.

Figure 4:
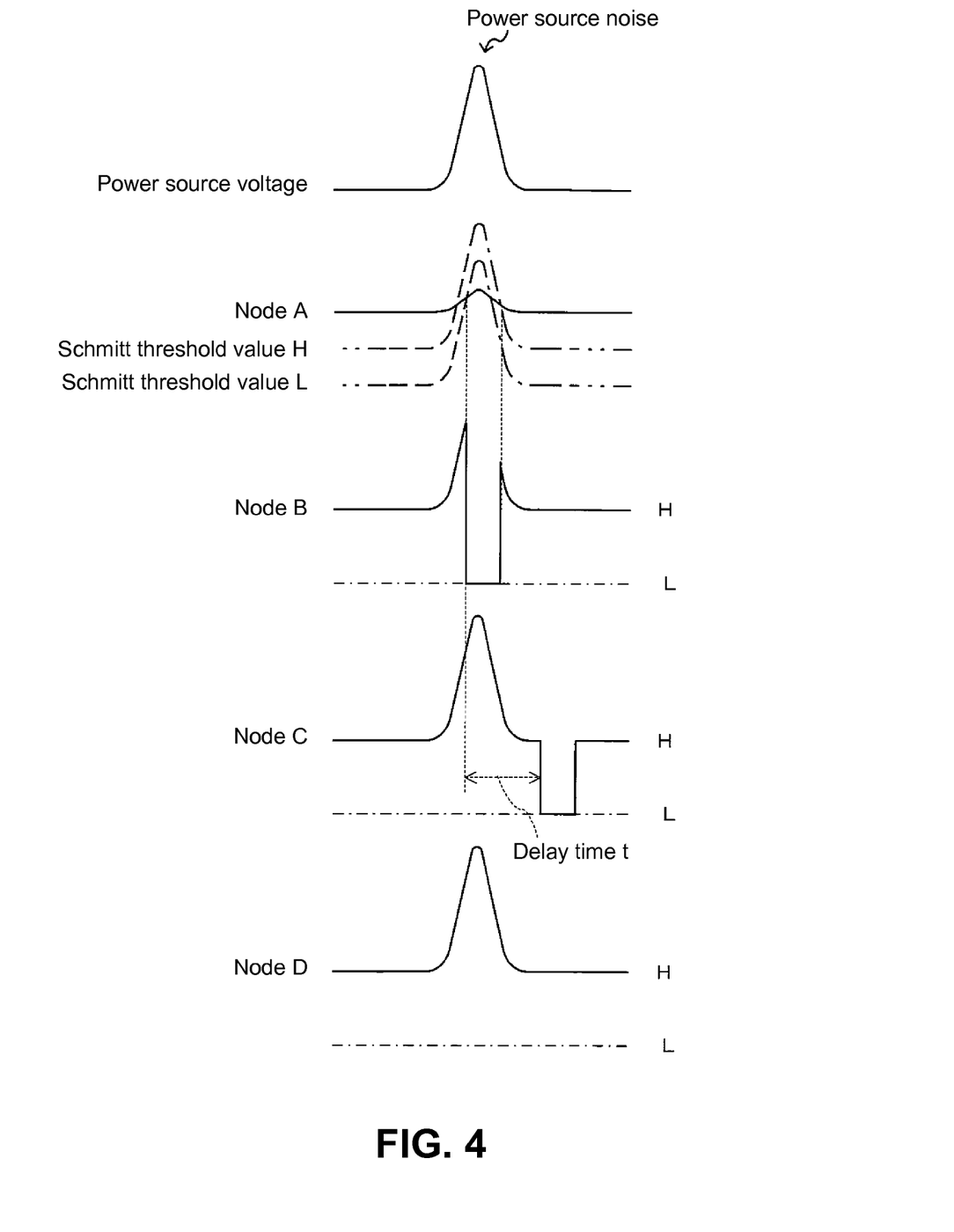
FIG. 4 is a schematic chart view showing a relationship among a power source voltage, a threshold value of a Schmitt circuit, and a voltage of each of nodes of the noise reduction circuit when a power source noise is generated according to the embodiment of the present invention.

FIG. 4 is a schematic chart view showing a relationship among the power source voltage, the Schmitt threshold value H and the Schmitt threshold value L of the Schmitt circuit 42, and a voltage of each of nodes of the noise reduction circuit 24 when the power source noise is generated according to the embodiment of the present invention.

As shown in FIG. 4, during a period of time when the noise reduction circuit 24 outputs the signal having the H level to the internal circuit, the power source voltage has the rapid fluctuation (the rapid increase) due to the power source noise. When the power source voltage has the rapid fluctuation, the Schmitt threshold value H and the Schmitt threshold value L of the Schmitt circuit 42 are fluctuated according to the rapid fluctuation. At this moment, the potential of the node A does not follow the fluctuation of the power source voltage, and becomes less than the Schmitt threshold value H and the Schmitt threshold value L. As a result, as shown in FIG. 4, the potential of the output signal of the Schmitt circuit 42 (the node B) has a glitch of an L level pulse.

In the embodiment, the delay circuit 46 is configured to delay and transmit the glitch. Accordingly, the glitch having the L level is generated in the potential of the node C (the delayed signal) as the later stage of the delay circuit 46 at the delayed timing. The output signal (the node B) of the Schmitt circuit 42 and the delayed signal (the node C) are input into the OR circuit 48, so that the OR circuit 48 outputs the logic sum thereof.

As shown in FIG. 4, when the glitch is generated in the output signal at the node B to have the L level, the delayed signal at the node C has the H level. On the other hand, when the glitch is generated in the delayed signal at the node C to have the L level, the output signal at the node B has the H level. In either case, the glitch is masked in the output signal (the node D) of the OR circuit 48. Accordingly, the potential of the output signal has the H level, and the output signal is not inverted to the L level. As a result, it is possible to prevent the output signal output from the noise reduction circuit 24 to the internal circuit from being inverted to the L level due to the power source noise, thereby preventing a malfunction of the internal circuit (the system).

As described above, in the embodiment, when the external circuit 12 outputs the oscillation signal to the semiconductor device 10 through the input terminal 20, the noise reduction circuit 24 removes the noise and outputs the oscillation signal to the internal circuit. Accordingly, it is possible to normally operate the internal circuit without the influence of the noise.

Next, the process of reducing the noise in the noise reduction circuit 26 will be explained. As describe above, the noise reduction circuit 26 has the function of reducing the noise of the signal (the oscillation signal) input from the external circuit 14, and outputting the signal to the internal circuit. It should be noted that the internal circuit to which the noise reduction circuit 26 outputs the signal may or may not be the same as the internal circuit to which the noise reduction circuit 24 outputs the signal, and the present invention is not limited to either case.

Figure 5:
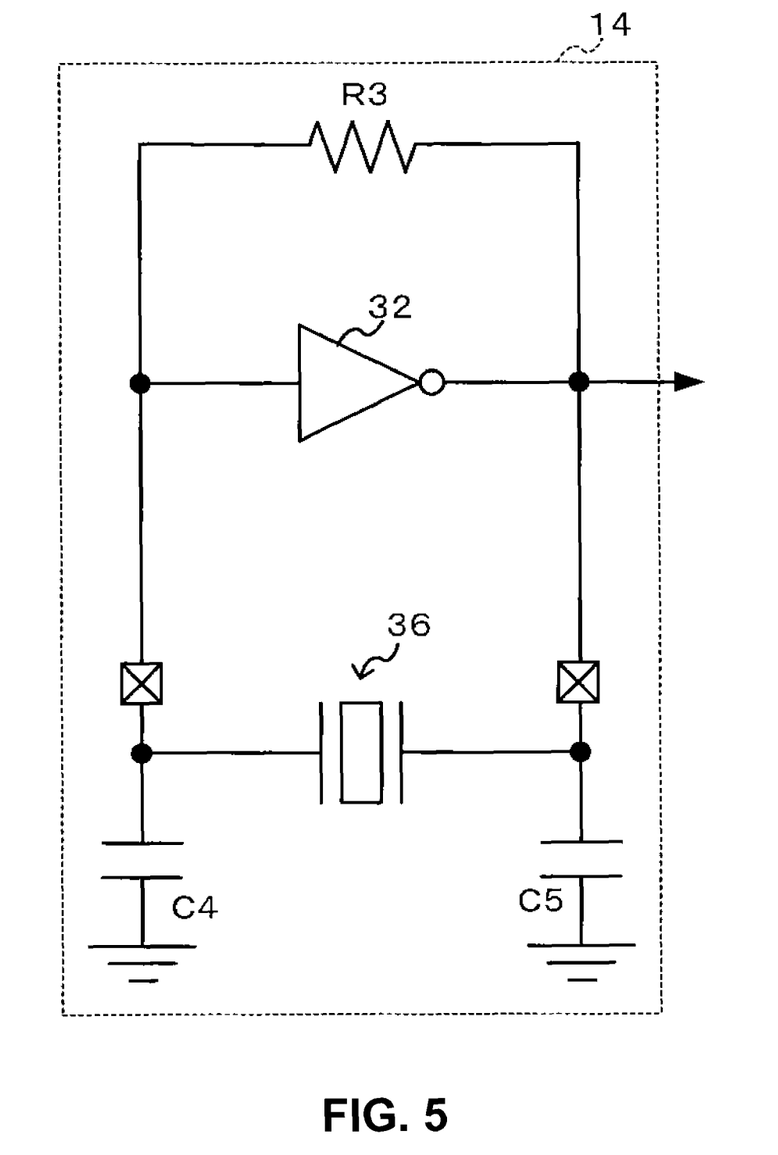
FIG. 5 is a circuit diagram showing an example of a configuration of another external circuit of the semiconductor integrated circuit according to the embodiment of the present invention.

FIG. 5 is a circuit diagram showing an example of a configuration of the external circuit 14 of the semiconductor integrated circuit 1 according to the embodiment of the present invention.

As shown in FIG. 5, the external circuit 14 is a crystal oscillation circuit including an inverter 32; a crystal oscillation element 36; a resistor element R3; a capacitor element C4; and a capacitor element C5. It should be noted that the external circuit 14 has the configuration similar to that of the external circuit 12 (refer to FIG. 2).

In the embodiment, similar to the external circuit 12, when the external circuit 14 outputs the oscillation signal, the capacitor element C3 and the capacitor element C5 are repeatedly charged and discharged, so that the crystal oscillation element 36 is oscillated to perform an oscillation operation. Then, the inverter 32 amplifies the oscillation signal, and the external circuit 14 outputs the oscillation signal. It should be noted that the external circuit 14 is configured to output the oscillation signal oscillating at a higher rate (the oscillation frequency is high) as compared with the external circuit 12.

Figure 6:
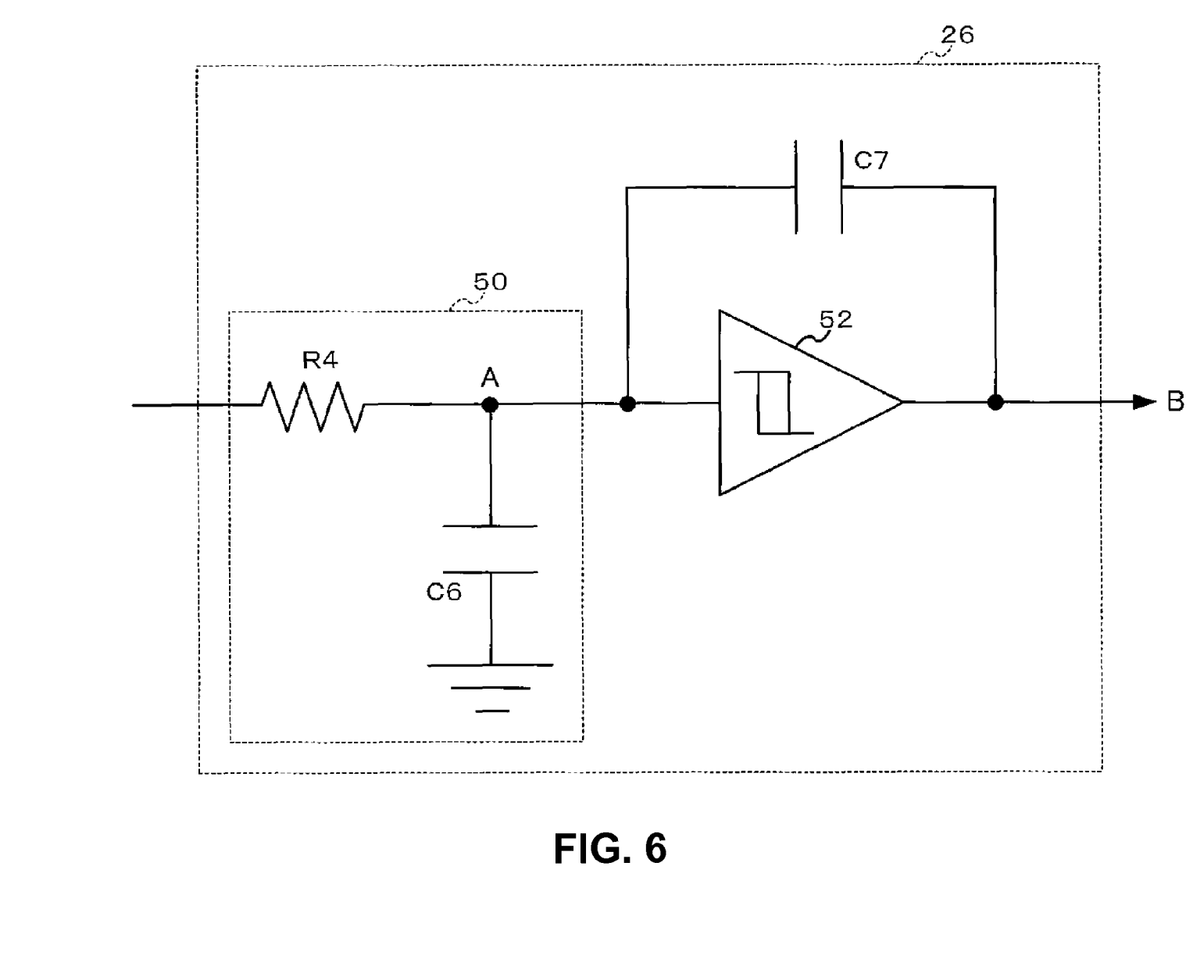
FIG. 6 is a circuit diagram showing an example of a configuration of another noise reduction circuit of the semiconductor integrated circuit according to the embodiment of the present invention.

In the embodiment, when the external circuit 14 outputs the oscillation signal, the oscillation signal is input into the noise reduction circuit 26 through the input terminal 22. FIG. 6 is a circuit diagram showing an example of a configuration of the noise reduction circuit 26 of the semiconductor integrated circuit 1 according to the embodiment of the present invention. As shown in FIG. 6, the noise reduction circuit 26 includes a low pass filter 50, a Schmitt circuit 52, and a capacitor element C7 having a function of adjusting the input signal.

In the embodiment, the low pass filter 50 is formed of a resistor element R4 and a capacitor element C6. Further, similar to the low pass filter 40 of the noise reduction circuit 24, the low pass filter 50 has a function of cutting the high frequency component of the oscillation signal input from the external circuit 14, on which the noise is superimposed, so that it is possible to minimize the rapid voltage fluctuation due to the external turbulent noise.

In the embodiment, the Schmitt circuit 42 has the Schmitt threshold value H and the Schmitt threshold value L (the Schmitt threshold value H>the Schmitt threshold value L).

In the embodiment, similar to the Schmitt circuit 42 of the noise reduction circuit 24, when the potential of the oscillation signal thus input exceeds the Schmitt threshold value H, the Schmitt circuit 52 outputs the signal having the H level. When the potential of the oscillation signal thus input is less than the Schmitt threshold value L, the Schmitt circuit 52 outputs the signal having the L level. Further, when the potential of the oscillation signal thus input is between the Schmitt threshold value H and the Schmitt threshold value L, the Schmitt circuit 52 maintains the level of the signal output immediately before.

In the embodiment, the noise reduction circuit 26 is configured such that the time constant of the low pass filter 50 and the Schmitt width of the Schmitt circuit 52 are adjusted according to the external turbulent noise superimposed on the oscillation signal input from the external circuit 14. The Schmitt width of the Schmitt circuit 52 is defined to be equal to the difference between the Schmitt threshold value H and the Schmitt threshold value L (the Schmitt threshold value H−the Schmitt threshold value L). Accordingly, the noise reduction circuit 26 has the function of removing the external turbulent noise superimposed on the oscillation signal thus input.

In the embodiment, in the noise reduction circuit 26, the capacitor element C7 is connected between the input terminal and the output terminal of the Schmitt circuit 52. The capacitor element C7 has a function of adjusting the potential of the input signal of the Schmitt circuit 52. More specifically, the capacitor element C7 has the function of adjusting the potential of the input signal (the node A) according to the potential of the output signal of the Schmitt circuit 52.

Figure 7:
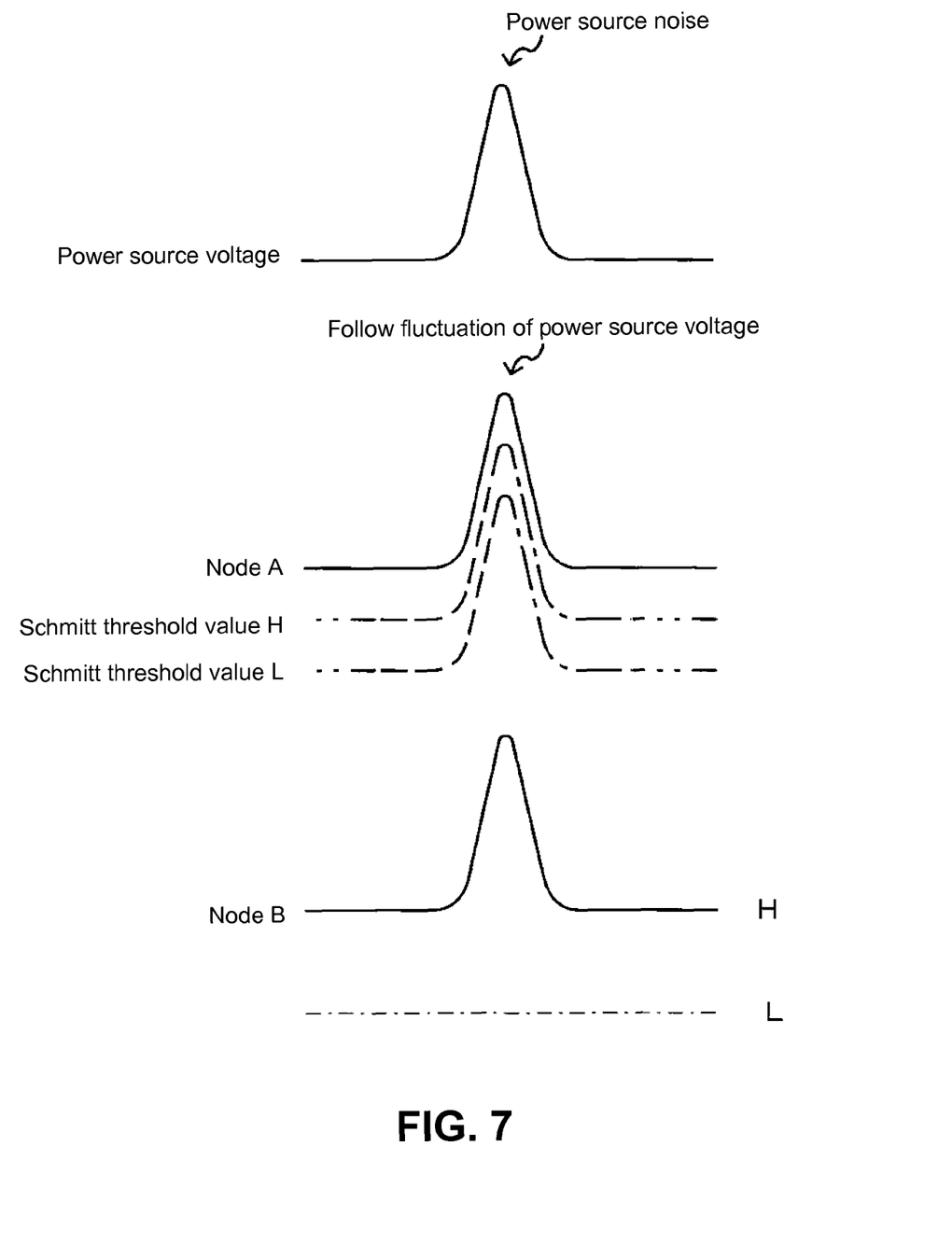
FIG. 7 is a schematic chart view showing a relationship among a power source voltage, a threshold value of a Schmitt circuit, and a voltage of each of nodes of another noise reduction circuit when the power source noise is generated according to the embodiment of the present invention.

FIG. 7 is a schematic chart view showing a relationship among the power source voltage, the Schmitt threshold value H and the Schmitt threshold value L of the Schmitt circuit 52, and a voltage of each of nodes of the noise reduction circuit 26 when the power source noise is generated according to the embodiment of the present invention.

As shown in FIG. 7, during a period of time when the noise reduction circuit 26 outputs the signal having the H level to the internal circuit, the power source voltage has the rapid fluctuation (the rapid increase) due to the power source noise. When the power source voltage has the rapid fluctuation, the Schmitt threshold value H and the Schmitt threshold value L of the Schmitt circuit 52 are fluctuated according to the rapid fluctuation. At this moment, the potential of the node A does follow the fluctuation of the output signal (the node B) and fluctuates (is increased) due to the capacitor element C7 connected between the input terminal and the output terminal of the Schmitt circuit 52. Accordingly, the potential of the node A follows and fluctuates according to the fluctuation of the power source voltage, and does not become less than the Schmitt threshold value H and the Schmitt threshold value L.

As a result, as shown in FIG. 7, the potential of the output signal (the node B) of the Schmitt circuit 52 does not have the glitch of the L level pulse, so that the output signal is not inverted to the L level. Accordingly, it is possible to prevent the output signal output to the internal circuit from the noise reduction circuit 26 from being inverted to the L level due to the power source noise, thereby making it possible to prevent a malfunction of the internal circuit (the system).

As described above, in the embodiment, when the external circuit 14 outputs the oscillation signal to the semiconductor device 10 through the input terminal 22, the noise reduction circuit 26 removes the noise and outputs the oscillation signal to the internal circuit. Accordingly, it is possible to normally operate the internal circuit without the influence of the noise.

In the embodiment, the glitch is generated in the noise reduction circuit 24. Depending on the width of the glitch thus generated, it may be difficult to mask the glitch within the oscillation cycle of the oscillation signal thus input. This phenomenon becomes more prominent as the oscillation frequency is increased. On the other hand, in the noise reduction circuit 26, the generation of the glitch itself is prevented, thereby preventing the phenomenon described above. Accordingly, it is possible to effectively remove the noise with respect to the external circuit 14 (the crystal oscillation circuit) having the high oscillation frequency, thereby making it possible to apply to the high operation speed system.

Further, as described above, the noise reduction circuit 26 is not provided with the delay circuit 46 that is disposed in the noise reduction circuit 24. Accordingly, the delay of the output signal is restricted. As a result, it is possible to apply to the output signal having the strict restriction with respect to the delay of the transmission.

As explained above, in the embodiment, the semiconductor device 10 of the semiconductor integrated circuit 1 includes the input terminal 20, the input terminal 22, the noise reduction circuit 24, and the noise reduction circuit 26. The oscillation signal from the external circuit 12 as the crystal oscillation circuit is input into the input terminal 20. After the oscillation signal is input into the input terminal 20, the noise reduction circuit 24 removes the noise from the oscillation signal, and the oscillation signal is output to the internal circuit disposed in the semiconductor device 10. Further, the noise reduction circuit 24 includes the low pass filter 40, the Schmitt circuit 42, and the output signal adjusting unit 44. Further, the output signal adjusting unit 44 includes the delay circuit 46 and the OR circuit 48.

In the embodiment, the low pass filter 40 and the Schmitt circuit 42 are provided for removing the external turbulent noise superimposed on the oscillation signal input through the input terminal 20. When the power source voltage is rapidly fluctuated due to the generation of the external turbulent noise, the Schmitt threshold value H and the Schmitt threshold value L of the Schmitt circuit 42 follow and fluctuate according to the rapid fluctuation. On the other hand, the potential (the node A) of the input signal of the Schmitt circuit 42 does not follow the rapid fluctuation. Accordingly, the potential (the node B) of the output signal has the glitch of the L level pulse, thereby inverting the output signal. However, the output signal and the output signal (the delayed signal) delayed by the delay circuit 46 are input into the OR circuit 48. The output signal has the glitch (the inversion) at the timing shifted from that of the glitch of the delayed signal. As a result, the output signal (the oscillation signal) output from the OR circuit 48 is not inverted and maintains the H level. Accordingly, it is possible to minimize the influence of the power source noise.

In the embodiment, the oscillation signal having the higher frequency that the oscillation signal input into the input terminal 20 is input into the input terminal 20. Further, the oscillation signal input into the input terminal 22 has more restriction with respect to the delay of the signal. Accordingly, it is possible to apply to the input signal (the oscillation signal) having the strict restriction with respect to the delay of the signal transmission. Further, the glitch is not generated in the output signal of the Schmitt circuit 52. Accordingly, it is possible to effectively remove the power source noise relative to the oscillation signal having the high frequency (oscillating at a high frequency).

As described above, in the semiconductor device 10 in the embodiment, it is possible to improve the noise tolerance with respect to the power source noise causing the fluctuation in the power source voltage through the different processes (the noise reduction circuit 24 and the noise reduction circuit 26) at the input terminal 20 and the input terminal 22 according to the oscillation signals thus input.

In the embodiment, the capacitor element C7 is disposed between the input terminal and the output terminal of the Schmitt circuit 52, and the capacitor element C7 has the function of adjusting the potential of the signal input into the Schmitt circuit 52. The present invention is not limited to the configuration. Alternatively, for example, the capacitor element C7 may be disposed between the input terminal of the Schmitt circuit 52 and the power source. In this case, with the capacitor element C7, the input signal (the node A) of the Schmitt circuit 52 fluctuates following the fluctuation of the power source voltage.

In the embodiment, the noise reduction circuit 24 and the noise reduction circuit 26 are disposed in the semiconductor device 10, so that the noise reduction circuit 24 and the noise reduction circuit 26 are configured to remove the noise of the signals (the oscillation signals) input from the external circuit 12 and the external circuit 14 disposed in the semiconductor integrated circuit 1 through the input terminal 20 and the input terminal 22, respectively. The present invention is not limited to the configuration. Alternatively, for example, the noise reduction circuit 24 and the noise reduction circuit 26 may be configured to remove the noise of a signal input from an apparatus disposed outside the semiconductor integrated circuit 1 into the semiconductor integrated circuit 1 through an external input terminal. Further, it may be configured as the noise reduction device including the noise reduction circuit 24 and the noise reduction circuit 26 (refer to the noise reduction device 29 shown in FIG. 1).

Further, in the embodiment, the semiconductor integrated circuit 1, the semiconductor device 10, the noise reduction circuit 24, and the noise reduction circuit 26 have the specific configurations for performing the specific operations as an example. The present invention is not limited to the configurations and the operations, and may be modified depending on a situation as long as the scope of the present invention is maintained.

The disclosure of Japanese Patent Application No. 2011-231615, filed on Oct. 21, 2011, is incorporated in the application by reference.

While the invention has been explained with reference to the specific embodiments of the invention, the explanation is illustrative and the invention is limited only by the appended claims.

What is claimed is:

1. A semiconductor device connected to an internal circuit, comprising:
   a first terminal for receiving a first signal;
   a second terminal for receiving a second signal;
   a first noise reduction circuit; and
   a second noise reduction circuit,
   wherein said first noise reduction circuit includes
   a first Schmitt circuit for receiving the first signal from the first terminal and outputting a first output signal; and
   an output signal adjusting unit for adjusting and outputting a second output signal to the internal circuit when the first output signal is maintained for a specific period of time after the first output signal is varied, and
   said second noise reduction circuit includes
   a second Schmitt circuit for receiving the second signal from the second terminal; and
   an input signal adjusting unit for adjusting the second signal input to the second Schmitt circuit according to a fluctuation of a power source voltage applied to the semiconductor device so that the second Schmitt circuit outputs a third output signal to the internal circuit.

2. The semiconductor device according to claim 1, wherein said output signal adjusting unit includes a delay circuit for receiving the first output signal, delaying the first output signal for a specific period of time, and outputting a fourth output signal, and a logic sum circuit for receiving the first output signal and the fourth output signal.

3. The semiconductor device according to claim 1, wherein said output signal adjusting unit includes a capacitor element connected between an input terminal and an output terminal of the first Schmitt circuit, or between the input terminal of the first Schmitt circuit and a power source.

4. The semiconductor device according to claim 1, wherein said first noise reduction circuit further includes a first low pass filter so that the first signal passes through the first low pass filter and is input into the first Schmitt circuit.

5. The semiconductor device according to claim 1, wherein said second noise reduction circuit further includes a second low pass filter so that the second signal passes through the second low pass filter and is input into the second Schmitt circuit.

6. The semiconductor device according to claim 1, wherein said second terminal is configured to receive the second signal having a frequency higher than that of the first signal.

7. A noise reduction device to be disposed in a semiconductor device that is connected to an internal circuit, comprising:
   a first noise reduction circuit; and
   a second noise reduction circuit,
   wherein said first noise reduction circuit includes
   a first Schmitt circuit for receiving a first signal from a first terminal disposed in the semiconductor device and outputting a first output signal; and
   an output signal adjusting unit for adjusting and outputting a second output signal to the internal circuit when the first output signal is maintained for a specific period of time after the first output signal is varied, and
   said second noise reduction circuit includes
   a second Schmitt circuit for receiving a second signal from a second terminal disposed in the semiconductor device; and
   an input signal adjusting unit for adjusting the second signal input to the second Schmitt circuit according to a fluctuation of a power source voltage applied to the semiconductor device so that the second Schmitt circuit outputs a third output signal to the internal circuit.

8. The noise reduction device according to claim 7, wherein said output signal adjusting unit includes a delay circuit for receiving the first output signal, delaying the first output signal for a specific period of time, and outputting a fourth output signal, and a logic sum circuit for receiving the first output signal and the fourth output signal.

9. The noise reduction device according to claim 7, wherein said output signal adjusting unit includes a capacitor element connected between an input terminal and an output terminal of the first Schmitt circuit, or between the input terminal of the first Schmitt circuit and a power source.

10. The noise reduction device according to claim 7, wherein said first noise reduction circuit further includes a first low pass filter so that the first signal passes through the first low pass filter and is input into the first Schmitt circuit.

11. The noise reduction device according to claim 7, wherein said second noise reduction circuit further includes a second low pass filter so that the second signal passes through the second low pass filter and is input into the second Schmitt circuit.

* * * * *